United States Patent
Sudraud et al.

(10) Patent No.: US 6,365,898 B1
(45) Date of Patent: Apr. 2, 2002

(54) SCANNING ELECTRON MICROSCOPE

(75) Inventors: Pierre Sudraud; Antoine Corbin; Rainer Sailer, all of Aix en Provence (FR); David John Bate, Cambridge (GB)

(73) Assignee: LEO Electron Microscopy Limited, Cambridge (GB)

( * ) Notice: Subject to any disclaimer, the term of this patent is extended or adjusted under 35 U.S.C. 154(b) by 0 days.

(21) Appl. No.: 09/308,372
(22) PCT Filed: Nov. 14, 1997
(86) PCT No.: PCT/GB97/03136
§ 371 Date: Sep. 13, 1999
§ 102(e) Date: Sep. 13, 1999
(87) PCT Pub. No.: WO98/22971
PCT Pub. Date: May 28, 1998

(30) Foreign Application Priority Data

Nov. 15, 1996 (GB) .............................. 9623768

(51) Int. Cl.[7] .................. H01J 37/244; G01N 23/00
(52) U.S. Cl. .................... 250/310; 250/311; 250/306; 250/307; 250/396 R; 250/397
(58) Field of Search ................... 250/310, 306, 250/307, 311, 397, 396 R

(56) References Cited

U.S. PATENT DOCUMENTS

| 4,596,929 A | * | 6/1986 | Coates et al. | 250/310 |
| 4,785,182 A | * | 11/1988 | Mancuso et al. | 250/310 |
| 4,992,662 A | * | 2/1991 | Danilatos | 250/310 |
| 6,184,525 B1 | * | 2/2001 | Van Der Mast | 250/310 |

* cited by examiner

Primary Examiner—Bruce Anderson
Assistant Examiner—Nikita Wells
(74) Attorney, Agent, or Firm—Lee, Mann, Smith, McWilliams, Sweeney & Ohlson

(57) ABSTRACT

A scanning electron microscope has means for generating a beam of electrons which is scanned over a specimen held within a holder in a chamber which contains a gaseous medium. A negative potential is applied to the holder so as to generate an electric field which accelerates secondary electrons, formed by the interaction or the primary beam with the specimen, in a direction away from the specimen surface and into a collision zone in the chamber. In that zone, the accelerated secondary electrons collide with gas molecules of the gaseous medium, thereby initiating a cascade of collisions which, in effect, amplifies the secondary electron signal. That signal (which may take the form of photons generated as a result of the collisions) is detected by detecting means, such as a photo-multiplier.

16 Claims, 3 Drawing Sheets

SCANNING ELECTRON MICROSCOPE

FILED OF THE INVENTION

This invention relates to a scanning electron microscope and to a method of analysing a specimen by means of such a microscope, wherein the specimen is situated within a chamber which contains a gaseous medium.

BACKGROUND TO THE INVENTION

The gaseous environment avoids or mitigates certain of the problems which arise from analysing a specimen in a high vacuum. For example, the gaseous environment may prevent or inhibit degradation of a biological specimen and can dissipate surface charges which would otherwise accumulate on a non conducting specimen to the detriment of image resolution.

In some electron microscopes, the gaseous environment is also used to amplify the secondary electron signal provided at the specimen. The secondary electrons obtained at the specimen as a result of the interaction with the scanning electron beam are accelerated towards an anode positioned generally above the sample. As the secondary electrons accelerate through the gaseous medium, they collide with gas molecules releasing further electrons which are also accelerated towards the anode. Since the electrons released by previous gas collisions can, in turn, release more electrons by further collisions in the gas, the acceleration of the original secondary electrons through the gas can trigger a cascade or avalanche of collisions which, in effect, provides the amplification.

European Patent No. EP-B1-330310 (Electroscan Corporation) and U.S. Pat. No. 4,785,182 (Mancuso et al) relate to examples of environmental scanning electron microscope (ESEM) which employ this gas amplification technique. Both microscopes detect the amplified secondary electron signal by measuring the current collected on the anodes used to accelerate the secondary electrons.

A paper of G D Danilatos published in 1992 (Proc. 50th annual meeting of the Electron Microscopy Society of America held jointly with the 27th annual meeting of the Microbeam Analysis Society and the 19th annual meeting of the Microscopical Society of Canada/Sociétéde Microscopie du Canada) discusses the possibility of detecting the amplified secondary electron signal by collecting photons generated in the electron avalanche in the gas, but still uses a positive electrode positioned 3 mm above the specimen to provide the necessary electron acceleration for the avalanche to occur.

The performance of these microscopes can be adversely affected by the interactions between the primary electron beam, i.e. the beam emitted from the electron column onto the specimen, and molecules of gas in the chamber.

SUMMARY OF THE INVENTION

According to a first aspect of the invention, there is provided a scanning electron microscope comprising generating means for generating a scanning beam of electrons and for delivering the beam into a chamber for containing a gaseous medium, the chamber having a specimen holder for holding a specimen to be analysed, the holder being electrically insulated from the surrounding structure which carries the holder, means for applying a negative potential to the holder so as to generate an electric field within the chamber, the arrangement being such that, in use, the scanning beam impinges on the specimen so as to provide secondary electrons on the specimen surface, the electric field accelerating the secondary electrons in a direction away from the specimen surface and into a collision zone in the chamber where collisions between the accelerated secondary electrons and the gas molecules of the gaseous medium initiate a cascade of collisions, thereby generating an amplified secondary electron signal, the scanning electron microscope further comprising detecting means for detecting the secondary electron signal.

By applying a negative potential to the specimen holder, the need for a separate positive electrode above the specimen is avoided. Consequently, the working distance in the chamber can be minimised, which correspondingly reduces any scattering of the primary beam by the gaseous medium. It has been found with this configuration that working distances of 1 mm or less can be achieved.

In addition, it has been discovered that, unexpectedly, the application of a negative potential to the specimen holder appropriately modifies conditions at the specimen surface (giving rise to said electric field at the surface even if the specimen is non conductive). Thus, the microscope can obtain images of both conductive and non-conductive specimens.

It has also been found that the risk of breakdowns in the gas is also minimised which allows relatively large fields to be applied to the specimen holder. The large fields, in turn, give rise to improved gas amplification of the secondary electron signal.

Preferably, the detecting means is arranged to detect photons generated as a result of said cascade of collisions in the gas.

Since the microscope can be configured to have a small working distance, the collision zone can be of a correspondingly small volume. In such a case, the density of photons generated in the zone is relatively high, and this facilitates photon collection by a photo-sensitive device (for example a photo-multiplier). Thus, this type of detecting means is particularly suitable for the microscope.

Preferably, the detecting means includes photo collection means comprising a light pipe which extends into the chamber and, in use, gathers photons generated in the collision zone and directs those photons to a detector.

Additionally or alternatively, the photon collection means may to advantage comprise a mirror in the chamber.

Preferably, the mirror is curved (preferably paraboloidal) so as to focus the photons on the detecting means or another point of the collection means (for example the light pipe).

Preferably, the collection means comprises the light pipe and the mirror, the mirror being arranged so as to reflect photons towards the light pipe in order to increase photon detection.

Conveniently, the means for applying a negative potential to the holder comprises an electrical lead which extends into the chamber to connect the holder to a voltage source.

Preferably, the microscope includes further electrode means situated adjacent the portion of the detecting means which receives the photons to be detected, and means for applying a positive voltage to said further electrode means.

The application of the positive voltage to the further electrode means draws the secondary electrons and negatively charged particles released in said cascade of collisions, towards the detecting means and thus moves the collision zone closer to the detecting means.

The further electrode means may to advantage comprise an electrical conductor which is situated between the front of the detecting means and the collision zone and is so apertured as to allow photons to pass from the collision zone to the detecting means. Such a conductor may be in the form of a grid.

The grid is conveniently mounted on the detecting means from which the grid preferably extends towards the collision zone.

Where the detecting means includes a light pipe, the grid is conveniently mounted on the end of the light pipe and lies on a notional substantially hemispherical or part ellipsoidal surface.

The invention also lies in a scanning electron microscope comprising generating means for generating a scanning bean of electrons and for delivering the bean onto a specimen in a gaseous medium in a chamber, electrode means for accelerating electrons, released from the specimen as a result of the beam, into a collision zone and photo detecting means for detecting photons released in said collision zone, wherein the electrode means is situated adjacent the detecting means, preferably in the paths of photons from the collision zone to the detecting means.

According to a second aspect of the invention, there is provided a method of analysing a specimen by a scanning electron microscope, the method comprising the steps of generating a scanning beam of electrons, directing the beam into a chamber containing a gaseous medium, and including a holder carrying the specimen, applying a negative bias potential to the holder so as to provide an electric field within the chamber, the scanning beam impinging on the specimen and producing on the specimen surface secondary electrons which are accelerated by the electric field in a direction taking the secondary electrons away from the specimen surface and into a collision zone in the chamber where collisions between the accelerated secondary electrons and the gas molecules of the gaseous medium initiated cascade of collisions and detecting the resulting signal.

Preferably, said signal comprises detectable photons generated by said cascade of collisions.

BRIEF DESCRIPTION OF THE DRAWINGS

The invention will now be described, by way of example only, with reference to the accompanying drawings, in which.

DETAILED DESCRIPTION

Figure 1:
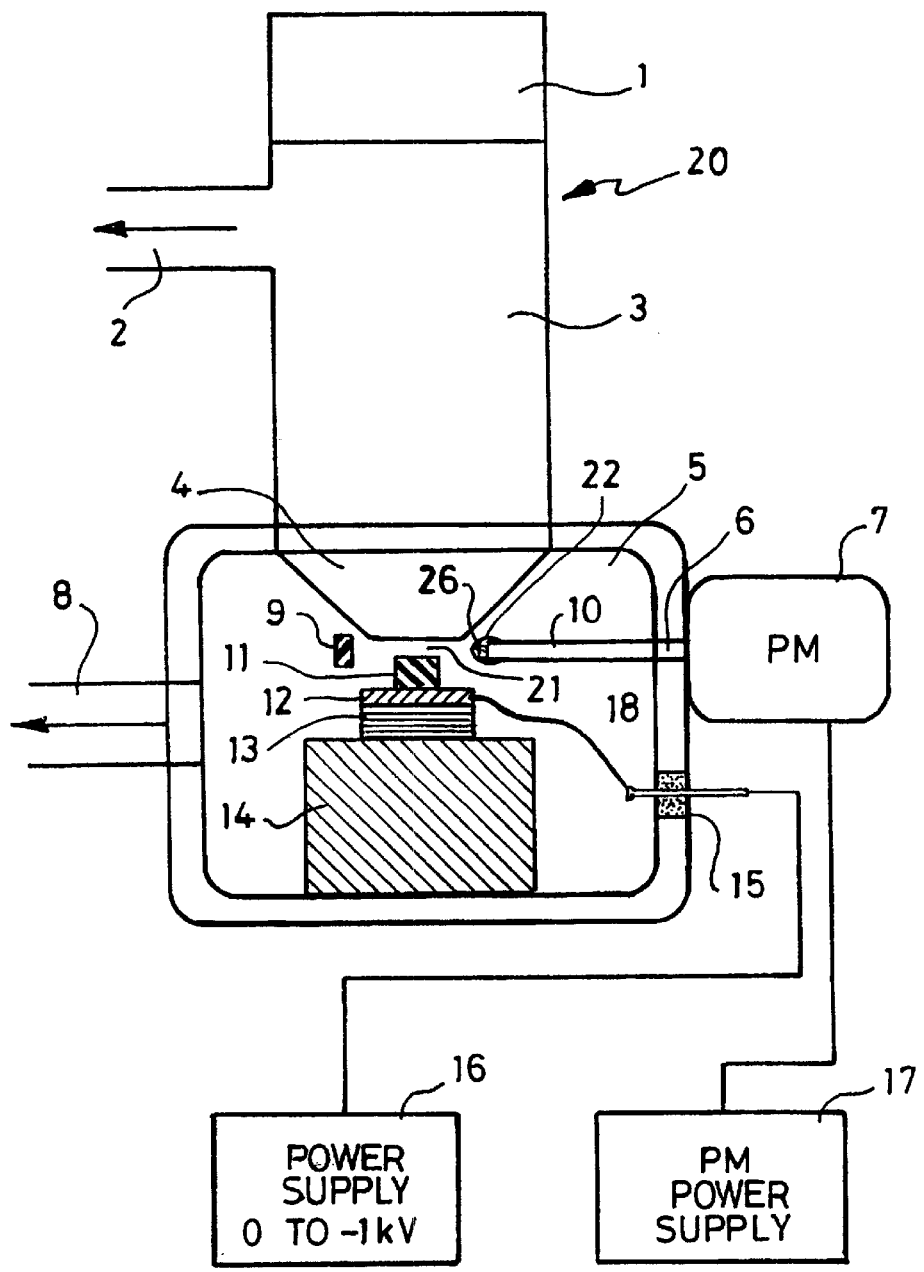
FIG. 1 is a schematic side view of an electron microscope in accordance with the invention.

The microscope shown in the drawing comprises generating means 20 for generating a beam of electrons which is scanned over a specimen 11 in a gaseous environment in a chamber 5.

The generating means comprises an electron gun 1 which supplies electrons to an electron column 3 for providing a focused electron beam which passes through an orifice in a bottom portion 4 of the column 3, and is scanned over the specimen 11.

Figure 2:
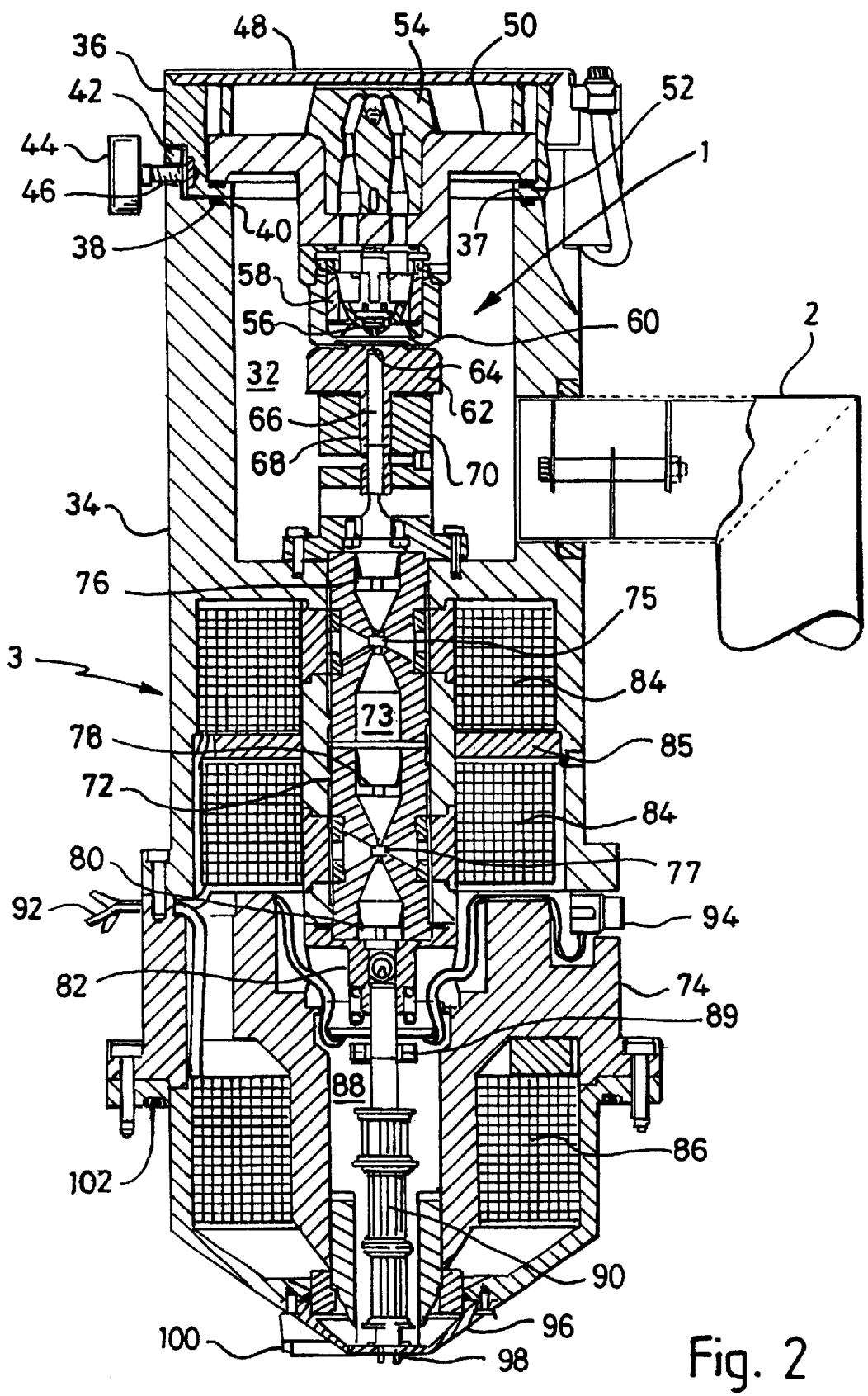
FIG. 2 is a sectional side elevation of part of the microscope.
Figure 5:
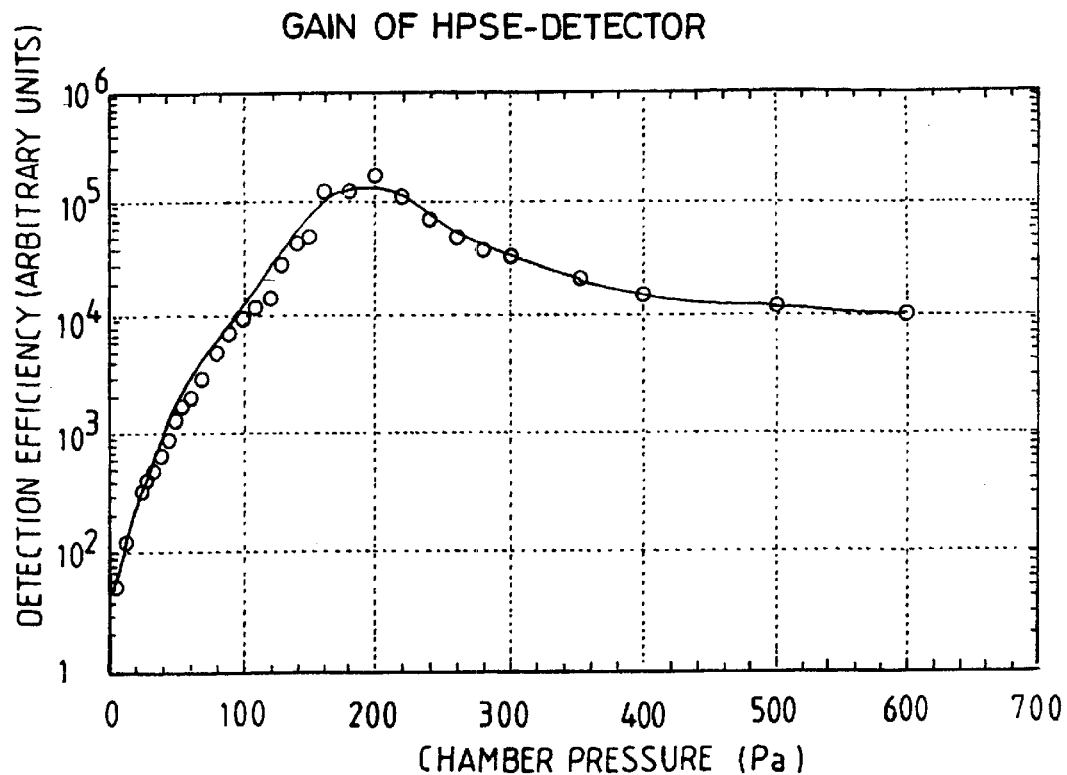
FIGS. 5 and 6 are graphs illustrating the results of tests on the performance of the microscope.

The various components of the gun 1 and column 3 are shown in FIG. 2.

The gun 1 is situated in a cylindrical cavity 32 in the upper portion of a housing 34. The top of the housing 34 supports a cap 36 having an inwardly directed flange 37 which sits on a O-ring seal 38 located in a corresponding circular groove in an upper shoulder 40 from the base of an upper cylindrical wall 42 in the housing 34. The lower portion of the cap 36 fits within the wall 42 with some clearance so that the position of the cap 36 and hence the gun relative to the housing 34 may be adjusted by means of an adjustment knob 44 and a screw-threaded shaft 46 which extends through the wall 42 to bear against a side of the cap 36. A cover 48 is secured to the top of the cap 36 and overlies a flanged cylindrical support 50 within the cap 36. The flange of the support 50 is urged against an O-ring seal 52 on an annular upward facing shoulder defined by the inwardly directed flange 37 on the base of the cap 36.

The support 50 partially accommodates an EHT plug 54 through which the gun is connected to a source of current and a source of negative voltage. The current is supplied to a filament cathode 56 held in position by means of an insulating mounting cylinder 58 attached to the base of the support 50. Also attached to the support 50 is a Wehnelt cylinder 60 for suppressing lateral emissions of electrons from the cathode, Negative voltage is applied to the Wehnelt cylinder 60. Electrons generated by the filament cathode 56 are accelerated towards a disc-shaped anode 62 situated just beneath the cylinder 60. An aperture 64 at the top of the anode communicates with a passage 66 in a hollow peg 68 depending from the bottom of the anode 62. The peg extends through a corresponding passage in an anode support 70 bolted to the bottom of the cavity 32.

The housing 34 is also provided with a central lower passage through which an elongate pole piece assembly 72 extends from the bottom of the cavity 32 to a lower end cap assembly 74.

The pole piece assembly 72 defines a central passage 73 which from top to bottom, tapers into the first pole piece gap 75, expands and then tapers into the second pole piece gap 77 before expanding again towards the bottom of the assembly 72. The assembly 72 retains three aperture discs 76, 78 and 80 which act as spray apertures to remove stray electrons from the beam. These discs are aligned with the beam path from the gun 1.

Disposed around the pole piece assembly 72 are two electrical coils 84 which are housed in an annular cavity in the housing 34, and which when a current is applied, form with the pole pieces 72 and their housing 34 a pair of condenser lenses. These lens are separated by a spacer ring 85.

The lower cap assembly 74 also has an annular cavity which accommodates a final electromagnetic lens 86. The lens 86 surrounds a central passage 88 in the assembly 74. The passage 88 is aligned with the passage in the housing 34, and accommodates electromagnetic scan coils 90. The current needed to operate the electromagnetic lenses and scan coils is supplied via electrical feed-throughs 92 and 94. The passage 88 also accommodates astigmatism correction coils 89.

The cap 74 has an end piece 96 which is of a trucated conical shape and is provided with a differential aperture 98.

The bottom of the cap assembly 74 also carries an electrical sensor 100 which acts as a touch alarm for warning the operator if the bottom of the column 3 comes into contact with anything in the chamber 5. The assembly 74 also carries a downwardly facing O-ring seal 102 for sealing against the housing which defines the cavity 5.

In use, electrons released at the filament cathode 60 are accelerated by the anode 62 to form a beam travelling in the general direction of the central axis of the column 3. As the beam travels through the pole piece assembly 72, the spray apertures 76, 78 and 80 remove electrons which are diverging to an appreciable extent from the beam axis, whilst the condenser lenses formed by the pole piece assembly 72 and the coils 84 focus the beam causing two beam crossovers. The beam then passes through the astigmatism correction coils 89 and past the final lens 86 and past the electromagnetic scan coils 90. The scan coil 90 cause the beam to scan a specimen in the chamber 5. The beam exits the bottom of the column through the aperture 98.

The aperture 98, whilst allowing the passage of the electron beam, inhibits the flow of gas from the chamber 5 into the column 3, to a degree which is a function of diameter and length of the aperture. A vacuum is maintained in the column 3 by means of a pump (not shown) connected to the vacuum port 2 which communicates with the cavity 32. For the sake of simplicity, only one vacuum port is shown, although it is possible for the design of the column 3 to be modified so that the column has several ports, each connected to a respective pump so that the column is differentially pumped so as to provide a higher vacuum in the region of the gun 1 than in the rest of the column 3. This higher vacuum is beneficial to the life span and emission stability of the gun 1, and also reduces the scattering of the electron beam as a result of interactions with gas in the column 3.

The chamber 5 also has an outlet port 8 which is connected to its own pumping system (not shown) for regulating the pressure of gas in the chamber 8. In this example, the pumping system includes a facility for the operator to control the pressure of gas in the chamber 5.

The bottom of the chamber 5 supports a table 14 on which a specimen holder 12 is mounted through a block 13 of insulating material. The table 14 is movably mounted in the chamber 5 and is connected to an adjustment mechanism (not shown) which enables the operator to adjust the position of the table 14, and hence the specimen 11 from outside the chamber 5, to bring a desired area of the specimen 11 into the path of the electron beam.

A mirror 9 is positioned above and to one side of the specimen 11 in opposing relationship to the outboard end of a light pipe 10 which extends into the chamber 5. The other end of the light pipe 10 is connected to a photo-multiplier 7, the power supply for which is denoted by the numeral 17.

Figures 3, 4:
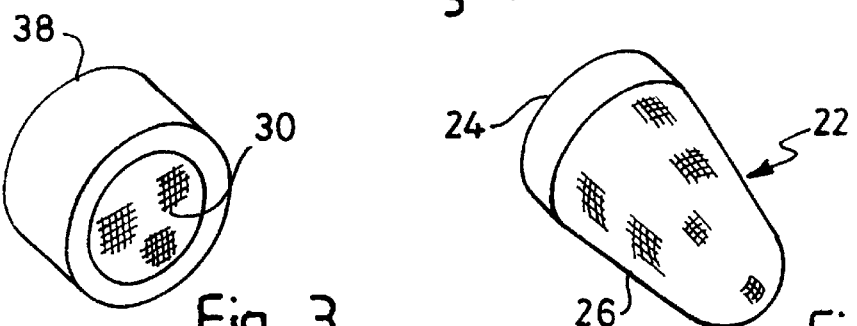
FIGS. 3 and 4 are more detailed views of two embodiments of one of the components of the microscope.

The end of the light pipe 10 carries a further electrode 22 which is connected to a further voltage source (not shown) for applying a positive potential of 0–400v to the further electrode 22. The further electrode 22 is shown in more detail in FIG. 3, from which it can be seen that the further electrode takes the form of a cap. The cap has an electrically conductive ring 24 which fits over, and embraces, the end of the light pipe 10.

A conductive grid in the form of a generally part ellipsoidal mesh 26 is attached to the ring 22, and extends from the front of the light pipe towards the area above the specimen 11.

The alternative embodiment of electrode shown in FIG. 2 also has a cap 28 and gauze 30, and is fitted onto the light pipe 10 in a similar fashion to the electrode shown in FIG. 2. However, in this case the gauze 30 does not extend away from the light pipe 10.

Another embodiment of electrode (not shown) comprises a coating of Tin Oxide on the front of the light pipe 10. The thickness of such a coating is chosen to be such that the coating is transparent to the photons to be collected by the light pipe 10.

The sample holder 12 is connected via a cable 18 to a feed, which extends through the wall of the chamber 5, and is in turn connected to a 0 to 1 kV variable power supply.

The chamber 5 and table 14 are earthed so that a negative potential applied by the power supply 16 to the holder 12 and the positive potential applied to the electrode 22 create an electric field in the chamber 5 which accelerates secondary electrons, formed by interaction with the scanning beam, in a direction away from the specimen 11 towards the front of the light pipe 10, and thus into a collision zone 21 in which a cascade of collisions occurs. Those collisions excite the gas molecules and create gaseous ions. Some of the photons generated by the relaxation or recombination of those molecules and ions are collected directly by the light pipe 10 whilst others are reflected on to the light pipe 10 by the mirror 9. In both cases, photons can travel through the gauze of the electrode 22 to be collected by the light pipe 10. The photons collected, directly or indirectly, by the light pipe 10 are supplied to the photo-multiplier 7 which generates an output signal. The microscope can optionally include a capillary tube (which, in this example, is of a diameter of 50 micrometers) which extends into the chamber 5 to a position adjacent the region of the specimen 11 and allows gas to be injected into the chamber 5.

It has been found that the best image quality is achieved by adjusting the negative bias potential applied to the holder 12 to a level just below the bias which would cause breakdown of the gas in the chamber 5, and hence a discharge without any electron beam. The bias power supply 16 therefore is current limited to avoid damage if a discharge voltage is accidentally reached during the bias adjustment. In the present example, the current limitation is achieved by means of a series resistor of 1–10 MΩ. The voltages applied to the specimen holder 11 typically lie within the range of 250 volts to 750 volts. As with other electron avalanche gas detectors, the best image voltage is a function of pressure, the nature of the gas in the chamber and of working distance.

The microscope has been successfully operated with gas pressures in the chamber 5 ranging from 50 Pa to 20,000 Pa.

FIG. 2 is a graph which illustrates the results of some of the tests of the performance of the microscope at various pressures. The different pressures are plotted along the x-axis of the graph, the y-axis of which represents the efficiency of detection of secondary electrons emitted by the specimen.

At low pressures, the yield (i.e. the signal produced by the photo-multiplier 7) is low. The microscope becomes fully operational at 50 Pa, and its yield rapidly increases to a maximum at 200 Pa. The yield then decreases, to a constant level for higher pressures.

Figure 6:
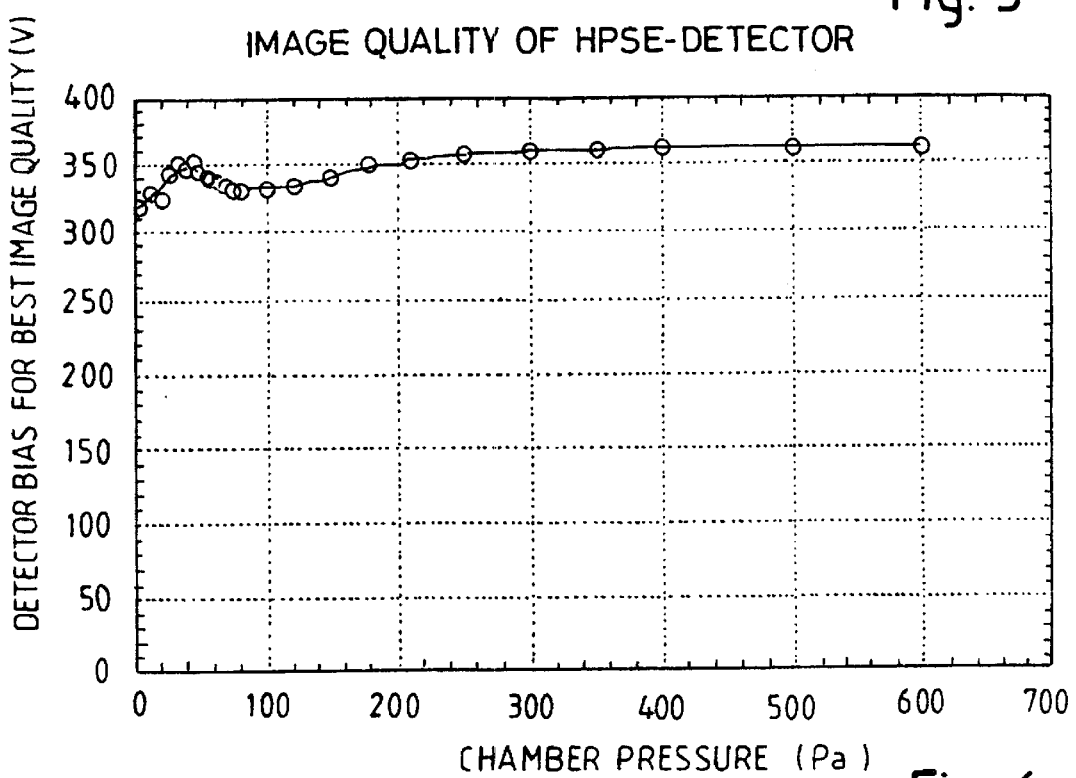

FIG. 6 is a graph of bias voltage (y-axis) against pressure (x-axis), and illustrates the best bias voltages for obtaining images at various different pressures. Each "best" bias voltage is just below the voltage at which discharge would occur in the gas in the absence of an electron beam.

It is to be understood that the microscope described and illustrated herein is an example of the invention, and that various modifications or alterations to the microscope are possible without taking it outside the scope of the invention. For example, the table on which the specimen holder is supported may be mounted on the door to the microscope chamber (rather than on the chamber base).

What is claimed is:

1. A scanning electron microscope comprising generating means for generating a scanning beam of electrons and for delivering the beam into a chamber for containing a gaseous medium, the chamber having a specimen holder for holding a specimen to be analysed, means for applying a negative potential to the holder so as to generate an electric field within the chamber, the arrangement being such that, in use, the scanning beam impinges on the specimen and provides secondary electrons which are accelerated by the electric field in a direction taking the secondary electrons away from the specimen surface and into a collision zone in the chamber where collisions between the accelerated secondary electrons and the gas molecules of the gaseous medium initiate a cascade of collisions thereby generating an amplified secondary electron signal, the microscope including detecting means for detecting the signal.

2. A scanning electron microscope according to claim 1, in which the detecting means is arranged to detect photons generated as a result of said cascade of collisions in the gas.

3. A scanning electron microscope according to claim 2, wherein the detecting means comprises a photo-multiplier.

4. A scanning electron microscope according to claim 2, wherein the detection means comprises collection means for gathering photons generated in the collision zone and directing them to a detector means.

5. A scanning electron microscope according to claim 4, in which the collection means comprises a light pipe which extends into the chamber.

6. A scanning electron microscope according to claim 5, in which the collection means comprises a mirror.

7. A scanning electron microscope according to claim 6, in which the mirror is arranged to reflect photons generated in the collision zone towards the light pipe.

8. A scanning electron microscope according to claim 6, in which the mirror is curved.

9. A scanning electron microscope according to claim 1, wherein the means for applying a negative potential to the support comprises an electrical lead which extends into the chamber to enable said negative potential to be applied to the specimen holder.

10. A scanning electron microscope according to claim 1, in which the microscope includes further electrode means situated adjacent the detecting means and means for applying a positive voltage to the further electrode means to shift said collision zone closer to the detecting means.

11. A scanning electron microscope according to claim 10, in which the further electrode means is interposed between the collision zone and the detecting means, and is apertured so as to allow photons to travel from the collision zone to the detecting means.

12. A scanning electron microscope according to claim 11, in which the further electrode means comprises an electrically conductive grid.

13. A scanning electron microscope according to claim 12, in which the grid is mounted on the detecting means, and extends therefrom towards the collision zone.

14. A scanning electron microscope according to claim 13, in which the grid lies on a notional hemispherical or part ellipsoidal surface.

15. A method of analysing a specimen by a scanning electron microscope, the method comprising generating a scanning beam of electrons, directing the beam into a chamber containing a gaseous medium and including a holder carrying the specimen, applying a negative bias potential to the holder so as to provide an electric field within the chamber, the scanning beam impinging on the specimen and producing on the specimen surface secondary electrons which are accelerated by the electric field in a direction taking the secondary electrons away from the specimen surface and into a collision zone in the chamber where collisions between the accelerated secondary electrons and the gas molecules of the gaseous medium initiate a cascade of collisions, and detecting and analysing the resulting signal.

16. A method according to claim 15, in which said signal comprises a cascade of detectable photons generated by said cascade of collisions.

* * * * *